US011424621B2

(12) United States Patent
Jain et al.

(10) Patent No.: US 11,424,621 B2
(45) Date of Patent: Aug. 23, 2022

(54) CONFIGURABLE REDUNDANT SYSTEMS FOR SAFETY CRITICAL APPLICATIONS

(71) Applicant: QUALCOMM Incorporated, San Diego, CA (US)

(72) Inventors: Palkesh Jain, Bangalore (IN); Rahul Gulati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 16/774,023

(22) Filed: Jan. 28, 2020

(65) Prior Publication Data

US 2021/0234376 A1    Jul. 29, 2021

(51) Int. Cl.
*H02J 4/00* (2006.01)
*G06F 1/18* (2006.01)
*G06F 1/3203* (2019.01)
*H01L 23/525* (2006.01)
*H01L 27/08* (2006.01)
*H02J 9/00* (2006.01)

(52) U.S. Cl.
CPC ............... *H02J 4/00* (2013.01); *G06F 1/189* (2013.01); *G06F 1/3203* (2013.01); *H01L 23/5256* (2013.01); *H01L 27/0805* (2013.01); *H02J 9/00* (2013.01)

(58) Field of Classification Search
CPC .... H02J 4/00; H02J 9/00; G06F 1/189; G06F 1/3203; G06F 1/28; G06F 1/30; G06F 11/1608; G06F 11/2015; G06F 11/002; H01L 23/5256; H01L 27/0805
See application file for complete search history.

(56) References Cited

U.S. PATENT DOCUMENTS

| 4,541,094 A | 9/1985 | Stiffler et al. |
| 5,119,373 A | 6/1992 | Fredricsson et al. |
| 5,923,512 A | 7/1999 | Brownlow et al. |

(Continued)

FOREIGN PATENT DOCUMENTS

| JP | H09101835 A | 4/1997 |
| WO | 2017222620 A1 | 12/2017 |

OTHER PUBLICATIONS

Bowman, K.A., et al., "A 22 nm All-Digital Dynamically Adaptive Clock Distribution for Supply Voltage Droop Tolerance," IEEE Journal of Solid-State Circuits, vol. 48, No. 4, Apr. 2013, IEEE, pp. 907-916.

(Continued)

*Primary Examiner* — Rexford N Barnie
*Assistant Examiner* — Thai H Tran
(74) *Attorney, Agent, or Firm* — Smith Tempel Blaha LLC/Qualcomm

(57) ABSTRACT

In certain aspects, a device comprises a first processing unit; a first power distribution network coupled to the first processing unit; a first decoupling capacitor coupled to the first power distribution network; a second processing unit configured to be identical to the first processing unit; a second power distribution network coupled to the second processing unit; and a second decoupling capacitor coupled to the second power distribution network, wherein the second decoupling capacitor is configured to have different effect on the second power distribution network than the first decoupling capacitor on the first power distribution network.

30 Claims, 7 Drawing Sheets

(56) References Cited

U.S. PATENT DOCUMENTS

| | | | |
|---|---|---|---|
| 6,526,559 | B2 | 2/2003 | Schiefele et al. |
| 6,882,182 | B1 | 4/2005 | Conn et al. |
| 6,892,345 | B1 | 5/2005 | Ghameshlu et al. |
| 7,224,178 | B2 | 5/2007 | Chang |
| 8,716,898 | B1 | 5/2014 | Liu et al. |
| 8,736,342 | B1 | 5/2014 | Bucelot et al. |
| 9,377,802 | B1 | 6/2016 | Wyland et al. |
| 10,331,532 | B2 | 6/2019 | Bansal et al. |
| 10,802,932 | B2 | 10/2020 | Refaeli et al. |
| 2003/0132669 | A1 | 7/2003 | Bahl et al. |
| 2005/0047040 | A1 | 3/2005 | Naffziger |
| 2005/0259502 | A1 | 11/2005 | Shimamura et al. |
| 2007/0200593 | A1 | 8/2007 | Agarwal et al. |
| 2007/0250750 | A1 | 10/2007 | Pourbigharaz et al. |
| 2007/0297156 | A1* | 12/2007 | Hosomi ............... H01L 23/50 361/763 |
| 2009/0115258 | A1 | 5/2009 | Flynn et al. |
| 2010/0155886 | A1* | 6/2010 | Kim ................ H01L 23/50 257/531 |
| 2010/0271092 | A1 | 10/2010 | Zerbe et al. |
| 2010/0295571 | A1 | 11/2010 | Weiberle et al. |
| 2011/0180898 | A1* | 7/2011 | Tomishima ........... H01L 23/66 257/532 |
| 2012/0047406 | A1 | 2/2012 | Nakatani et al. |
| 2012/0139603 | A1 | 6/2012 | Chen et al. |
| 2013/0238945 | A1 | 9/2013 | Vilela et al. |
| 2014/0374877 | A1* | 12/2014 | Oh ................. H01L 23/5223 257/532 |
| 2015/0061707 | A1 | 3/2015 | Balasubramanian et al. |
| 2015/0177824 | A1 | 6/2015 | Ganpule et al. |
| 2015/0236696 | A1 | 8/2015 | Saen et al. |
| 2016/0246363 | A1* | 8/2016 | Chen ..................... G06F 1/26 |
| 2017/0227981 | A1 | 8/2017 | Yuyama et al. |
| 2018/0205235 | A1 | 7/2018 | Yuan |
| 2019/0098327 | A1 | 3/2019 | Marinelli et al. |
| 2019/0205270 | A1 | 7/2019 | Leung et al. |
| 2019/0235568 | A1 | 8/2019 | Ou |
| 2019/0245382 | A1 | 8/2019 | Liu et al. |
| 2019/0391888 | A1* | 12/2019 | Meriac ............... G06F 11/1497 |
| 2020/0019477 | A1 | 1/2020 | Jain et al. |

OTHER PUBLICATIONS

Bowman K.A., et al., "A 16 nm All-Digital Auto-Calibrating Adaptive Clock Distribution for Supply Voltage Droop Tolerance Across a Wide Operating Range", IEEE Journal of Solid-State Circuits, Jan. 2016, vol. 51, No. 1, pp. 8-17.

Patil V.C., "Effect of Clock and Power Gating on Power Distribution Network Noise in 2D and 3D Integrated Circuits," Masters Theses, Sep. 2014, 90 pages.

Suresh V.B., et al., "Variation Aware Design of Post-Silicon Tunable Clock Buffer," 2014 IEEE Computer Society Annual Symposium on VLSI, Jul. 9-14, 2014, 6 pages.

International Search Report and Written Opinion—PCT/US2021/015184—ISA/EPO—dated May 6, 2021.

\* cited by examiner

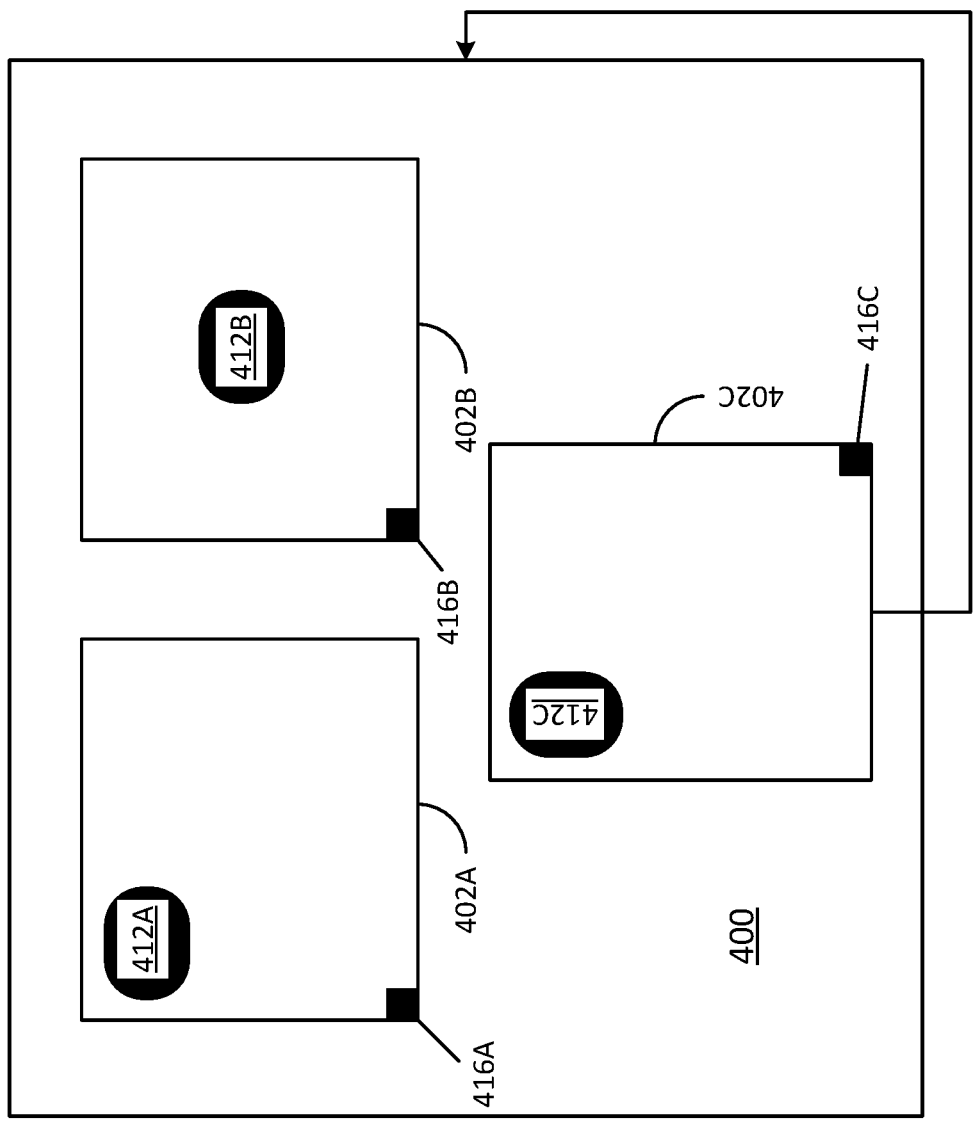

CONFIGURABLE REDUNDANT SYSTEMS FOR SAFETY CRITICAL APPLICATIONS

CROSS-REFERENCES TO RELATED APPLICATIONS

The present application is related to U.S. patent application Ser. No. 16/031,813, filed on Jul. 10, 2018, entitled "Diverse Redundant Processing Modules for Error Detection," which is expressly incorporated by reference herein in its entirety.

BACKGROUND

Field

Aspects of the present disclosure relate to redundant systems, and more particularly, to configurable decoupling capacitors in redundant systems for false negative reduction.

Background

The integrated circuit (IC) is a core component of many electronic systems. High performance computer systems, including those used for medical instruments, automobile controllers, satellites, and other advanced processing require high reliability, high quality complex ICs to ensure the safety and accuracy of analytical data they process. Microprocessors and other complex ICs (i.e. GPGPU) are predominantly considered the important components within these systems. They are susceptible to electrical, mechanical and thermal modes of failure like other components on a printed circuit boards. Sometimes, errors are caused by faulty design, in which case these errors may be considered systematic errors. Sometimes, processing errors have random causes, in which case these errors may be considered random errors. Random processing errors may be caused by, for example, device aging, power delivery fluctuations, process variations in the manufacture of the device, cosmic-ray-induced soft errors, and other environmentally induced soft errors. These random causes can, for example, affect the temporal propagation of signals such that the signals fail to timely arrive at a component, thereby causing the component to provide an erroneous output.

For many applications, occasional random errors are tolerable. For some applications, however—such as, for example, safety-critical applications—random errors need to be avoided as completely as possible. Examples of safety critical applications include, for example, advanced driver-assistance systems (ADAS), which may need to comply with safety standards such as ISO 26262 for the functional safety of electrical components, including ADAS, in automobiles.

One conventional strategy for avoiding random errors is to capture random errors by having multiple redundant processors, which have the same circuit design, simultaneously perform the same computational tasks on the same inputs and then their outputs are compared. The multiple processors are typically separate substantially identical cores of a system-on-chip (SoC) device. If the compared outputs match, then the comparator provides a pass output indicating no error. If the compared outputs do not match, then the comparator provides a no pass output, indicating an error.

If the compared outputs do not match, then the likely culprit is a random error since the tasks and processors are designed to be identical. The corresponding computation may then be discarded as unreliable and the computation started anew. However, in a multi-processor device, such as a SoC, where all of the processors are manufactured together and co-located on a shared substrate, all of the processors can simultaneously suffer from the same random error, which can lead the comparator to determine that the outputs—because they match—are all correct when, in fact, they are all erroneous. For example, a variation of power supply voltage may cause a plurality of processors to have similar timing faults leading to a plurality of erroneous outputs, which do, however, match each other, thereby resulting in an incorrect determination that the outputs are error-free. Therefore, it is beneficial to reduce the likelihood of false negatives from power supply voltage variation.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a device comprises a first processing unit; a first power distribution network coupled to the first processing unit; a first decoupling capacitor coupled to the first power distribution network; a second processing unit configured to be identical to the first processing unit; a second power distribution network coupled to the second processing unit; and a second decoupling capacitor coupled to the second power distribution network, wherein the second decoupling capacitor is configured to have different effect on the second power distribution network than the first decoupling capacitor on the first power distribution network.

In another aspect, operating a first processing unit, wherein the first processing unit is electrically coupled to a first power distribution network and a first decoupling capacitor is electrically coupled to the first power distribution network; and operating a second processing unit configured to be identical to the first processing unit, wherein the second processing unit is electrically coupled to a second power distribution network and a second decoupling capacitor is electrically coupled to the second power distribution network, wherein the second decoupling capacitor is configured to have different effect on the second power distribution network than the first decoupling capacitor on the first power distribution network.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 4A illustrates an exemplary redundant system power distribution networks decoupling capacitors placement according to certain aspect of the present disclosure.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

The power distribution network distributes power and ground voltages to all devices in a design. Shrinking device dimensions, faster switching frequencies and increasing power consumption in deep sub-micrometer technologies cause large switching currents to flow in the power and ground networks which degrade performance and reliability. A robust power distribution network is essential to ensure reliable operation of circuits on a chip. Excessive voltage fluctuation in the power grid reduce switching speeds and noise margins of circuits, and inject noise which might lead to functional failures. Capacitance between power and ground distribution networks, referred to as decoupling capacitors or decaps, acts as local charge storage and is helpful in mitigating the voltage drop at supply points. The crux of the problem in designing a power grid is that there are many unknowns until the very end of the design cycle. It is beneficial if the decoupling capacitor for the power distribution network is configurable.

Figure 1:
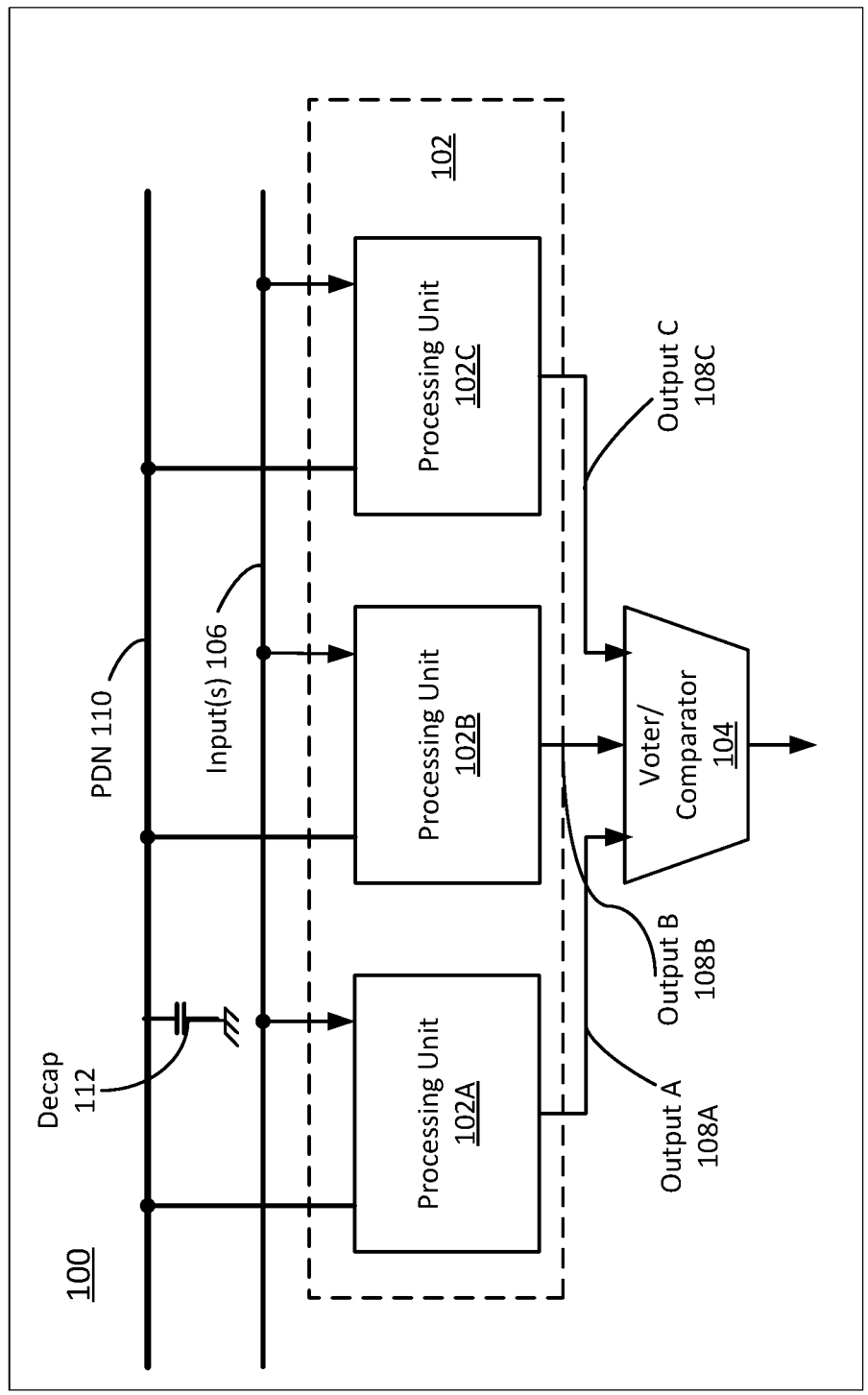
FIG. 1 illustrates a sample redundant system power distribution network according to certain aspect of the present disclosure.

FIG. 1 illustrates a sample redundant system power distribution network according to certain aspect of the present disclosure. The system 100 may be an SoC device. The system 100 comprises a plurality of redundant processing units 102, such as a first processing unit 102A, a second processing unit 102B, and a third processing unit 102C, and a voter/comparator 104. All of the processing units 102 have same circuit design, including same circuit specification, configuration, and physical layout and footprint so that given identical inputs 106—and barring any unique processing errors—each would produce identical outputs 108A, 108B, and 108C. Note that inputs 106 to the processing units 102 include both commands and data. The processing units 102, however, may be in different location (but often in adjacent area) and may have different orientation.

A processing unit 102A, 102B, or 102C may be, for example, a central processing unit (CPU), a graphics processing unit (GPU), a neural-network processing unit (NPU), a digital signal processor (DSP), or other processor/controller. When each of the plurality of processing units 102 performs redundant processing of corresponding identical inputs 106, the voter/comparator 104 compares corresponding output signals—such as, e.g., outputs 108A, 108B, and 108C—of the processing units 102 to determine whether a unique processing error occurred in one of the processing units 102. Specifically, if the voter/comparator 104 determines that the outputs 108A, 108B, and 108C are not all identical, then the voter/comparator 104 provides an output indicating that at least one of the processing units 102 suffered a processing error.

The system 100 also comprises a common power distribution network 110. The common power distribution network 110 couples to each of the plurality of processing units 102A, 102B, and 102C. To ensure the robust operation of the plurality of processing units 102, a decoupling capacitor 112 is coupled to the power distribution network 110. The decoupling capacitor 112 may comprise one or more on-chip capacitors, such as MIM capacitors, or off-chip capacitors, such as capacitors on packaging or even on PCB.

There are likelihood of random failures affecting all of the plurality of processing units 102 simultaneously and resulting in the same corrupted outputs 108A, 108B, and 108C. For example, each of the processing units 102A, 102B, and 102C may experience power droop event in the common power distribution network 110, resulting in same timing failure. It is beneficial, therefore, to have diversity in power distribution network for the plurality of processing units 102.

Figure 2:
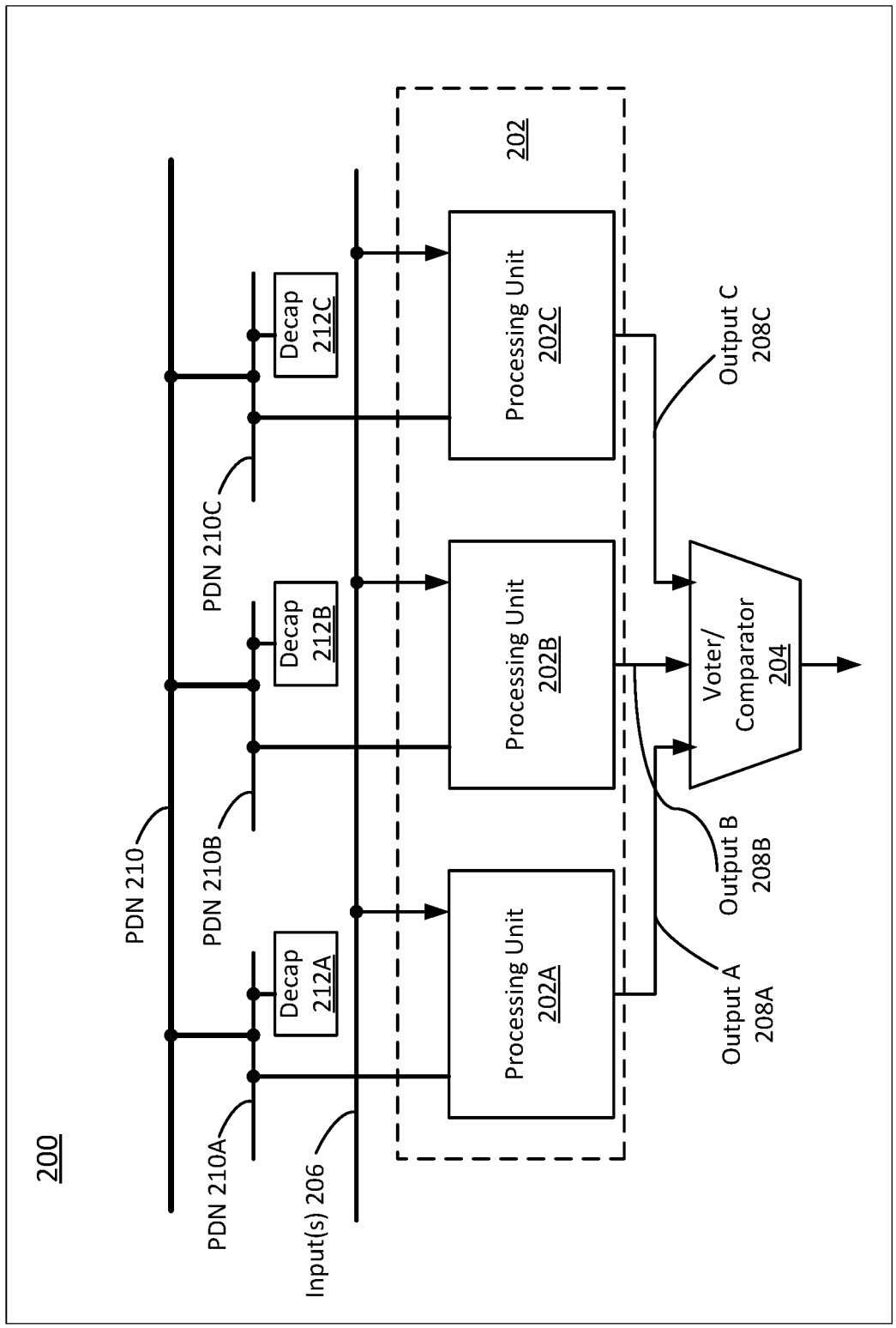
FIG. 2 illustrates an exemplary redundant system power distribution network according to certain aspect of the present disclosure.

FIG. 2 illustrates an exemplary redundant system power distribution network according to certain aspect of the present disclosure. Like the system 100, the SoC 200 may be an integrated circuit device. The SoC 200 comprises a plurality of redundant processing units 202, such as a first processing unit 202A, a second processing unit 202B, and in some embodiment a third processing unit 202C, and a voter/comparator 204. All of the processing units 202 are identical, meaning, except for unavoidable variation, they have same circuit design, including same circuit specification, configuration, and physical layout and footprint so that given identical inputs 206—and barring any unique processing errors—each would produce identical outputs 208A, 208B, and 208C. Note that inputs 206 to the processing units include both commands and data. The processing units 202, however, may be in different location (but often in adjacent area) and may have different orientation.

A processing unit 202A, 202B, or 202C may be, for example, a central processing unit (CPU), a graphics processing unit (GPU), a neural-network processing unit (NPU), a digital signal processor (DSP), or other processor/controller. When each of the plurality of processing units 202 performs redundant processing of corresponding identical inputs 206, the voter/comparator 204 compares corresponding output signals—such as, e.g., outputs 208A, 208B, and 208C—of the processing units 202 to determine whether a unique processing error occurred in one of the processing units 202. Specifically, if the voter/comparator 204 determines that the outputs 208A, 208B, and 208C are not all identical, then the voter/comparator 204 provides an output indicating that at least one of the processing units 202 suffered a processing error.

The SoC 200 also comprises a common power distribution network 210. The common power distribution network 210 couples to each of the plurality of processing units 202A, 202B, and 202C through respective local power distribution network, e.g., a first power distribution network 210A, a second power distribution network 210B, and a third power distribution network 210C. To ensure robust operation of the plurality of processing units 202, each of the local power distribution network 210A, 210B, and 210C couples to a respective decoupling capacitor, e.g., a first decoupling capacitor 212A, a second decoupling capacitor 212B, and a third decoupling capacitor 212C.

The decouple capacitors 212A, 212B, and 212C are configurable to adjust the effect on the respective local power distribution network 210A, 210B, and 210C. As a result, barring regular process, voltage, and temperature variation, the local power distribution networks 210A, 210B, and 210C react differently to a power event, such as different droop, glitch, etc. due to the difference in the decoupling capacitors 212A, 212B, and 212C. For example, the capacitance values of the decoupling capacitors 212A, 212B, and 212C are configured to be different from each other so that each of the local power distribution networks 210A, 210B, and 210C may respond differently to a power event. The decoupling capacitor 212A may have a first capacitance value that is different from that of the second decoupling capacitor 212B, which has a second capacitance value. That is, each of the local power distribution networks 210A, 210B, and 210C has different power droop or glitch. As a result, same timing error due to supply voltage variation may be minimized or avoided. The likelihood of false negatives from power supply voltage variation is reduced.

Figure 3A:
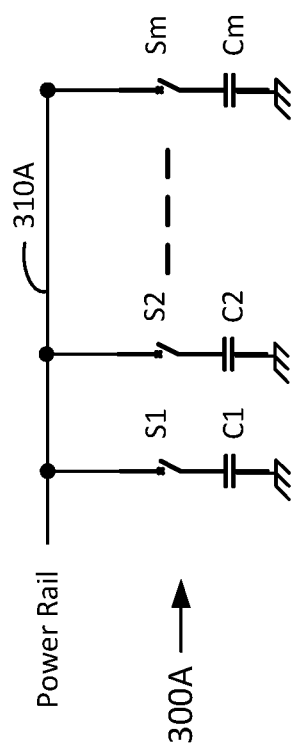
FIG. 3A illustrates an exemplary configurable decoupling capacitor according to certain aspects of the present disclosure.

FIG. 3A illustrates an exemplary configurable decoupling capacitor according to certain aspects of the present disclosure. The decoupling capacitor 300A comprises a plurality of capacitors C1, C2, ..., Cm, each couples to a respective switch S1, S2, ..., Sm, all of which couple to a power rail 310A. The states of the switches S1, S2, ..., Sm determine whether the respective capacitors C1, C2, ..., Cm electrically couple to the power rail 310A. If a switch is on or closed, then the respective capacitor is electrically coupled to the power rail 310A. Otherwise, if the switch is off or open, then the respective capacitor is electrically decoupled from the power rail 310A. By turning on or off, closing or opening the plurality of switches S1, S2, ..., Sm, the decoupling capacitor 300A is configured to have different capacitance value.

Figure 3B:
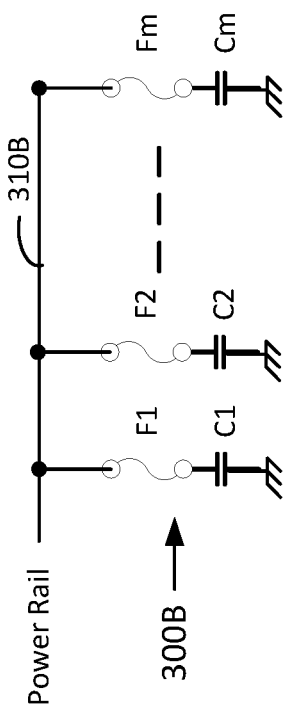
FIG. 3B illustrates an exemplary implementation of configurable decoupling capacitor using fuses according to certain aspects of the present disclosure.

FIG. 3B illustrates an exemplary implementation of configurable decoupling capacitor using fuses according to certain aspects of the present disclosure. The decoupling capacitor 300B, likes the decoupling capacitor 300A, comprises a plurality of capacitors C1, C2, ..., Cm. each of the plurality of the capacitors C1, C2, ..., Cm couples to a respective switch, which determines whether the respective capacitors C1, C2, ..., Cm electrically couple to the power rail 310B. The switches, however, are implemented as a plurality of eFuses F1, F2, ..., Fm. An eFuse is a one-time programmable memory that is programmed by applying a programming voltage and forcing a high current density through a conductor link to completely rupture the link or make the resistance significantly higher. There are many types of eFuses, such as poly fuse, metal fuse, MOS floating gate, etc. If any of the plurality of eFuses F1, F2, ..., Fm are not programmed, there are low resistive paths coupling the respective capacitors C1, C2, ..., Cm to the power rail 310B. If any of the plurality of eFuses F1, F2, ..., Fm are programmed with high currents, the resistances between the respective capacitors C1, C2, ..., Cm to the power rail 310B are high and the respective capacitors C1, C2, ..., Cm to the power rail 310B are effectively permanently (or statically) electrically decoupled.

Alternatively, for example, the eFuse F1, F2, ..., Fm can be antifuse. An antifuse is an electrical device that performs the opposite function to a fuse. Whereas a fuse starts with a low resistance and is designed to permanently break an electrically conductive path (typically when the current through the path exceeds a specified limit), an antifuse starts with a high resistance, and programming it converts it into a permanent electrically conductive path (typically when the voltage across the antifuse exceeds a certain level).

Alternatively, for another example, the eFuse F1, F2, ..., Fm can be programmed by laser. In this case, fuses are blown by the laser without internal programming circuitry, enabling or disabling various coupling between each of the plurality of capacitors C1, C2, ..., Cm with the power rail 310B. Laser programming has the advantage of saving of on-die programming circuitry and can be easily programmed post-silicon.

Figure 3C:
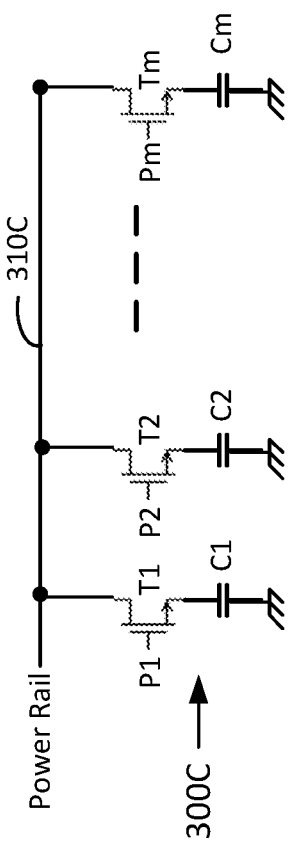
FIG. 3C illustrates an exemplary implementation of configurable decoupling capacitor using transistors according to certain aspects of the present disclosure.

Other means for eFuse F1, F2, ..., Fm programming are possible. Further, the coupling between the capacitors and the power rail may be implemented with active devices. FIG. 3C illustrates an exemplary implementation of configurable decoupling capacitor using transistors according to certain aspects of the present disclosure. The decoupling capacitor 300C, likes the decoupling capacitor 300A, comprises a plurality of capacitors C1, C2, ..., Cm. each of the plurality of the capacitors C1, C2, ..., Cm couples to a respective switch, which determines whether the respective capacitors C1, C2, ..., Cm electrically couple to the power rail 310C. The switches, however, are implemented as a plurality of transistors T1, T2, ..., Tm. The transistors T1, T2, ..., Tm are configured to be either dynamically or permanently turned on or dynamically or permanently turned off. As a result, the respective capacitors C1, C2, ..., Cm may be dynamically or statically coupled to the power rail 310C or dynamically or statically decoupled to the power rail 310C. This can be done by applying varied fixed voltages to the gates of the transistors P1, P2, ..., Pm. The fixed voltages to the gates P1, P2, ..., Pm may be power supply voltage or ground voltage. The fixed voltage to the gates P1, P2, ..., Pm may be provided by a non-volatile memory, such as RRAM, PRAM, MRAM, or a Fuse (not shown). The non-volatile memory may be part of the power management unit (not shown) and may be programmable by a logic (not shown) in the power management unit.

In addition, there are alternative ways to making the plurality of capacitors C1, C2, ..., Cm. For example, the plurality of capacitors C1, C2, ..., Cm may be metal-insulator-metal (MIM) capacitors, metal-oxide-metal (MOM) capacitors, metal-on-semiconductor (MOS) capacitors, any other suitable capacitors, or a combination thereof. In MIM capacitors, metal plates are stacked on top of each other and separated by a (thin) layer of silicon oxide. Usually this thin oxide is made in a special processing step as the "normal" oxide between metal layers is much thicker (for robustness), which would result in much less capacitance per area. The MIM capacitors are often placed on top of the metal stack or with the top metal layers. MOM capacitors are comprised of vertical and lateral interleaved metal fingers using existing metal layers. MOM capacitors are pervasive in advanced CMOS technologies because of their lower fabrication cost and high capacitance density when compared to thin-film metal-insulator-metal (MIM) and MOS capacitors.

The configurability of the decoupling capacitors and availability of various programming means and various capacitor types offer flexibility in providing diversity in power distribution network for the plurality of processing units in a redundant system, such as the diversity among the power distribution networks 210A, 210B, 210C in the SoC 200. For example, By using fuses F1, F2, . . . , Fm in FIG. 3B or transistors T1, T2, . . . , Tm in FIG. 3C, the capacitance values for the decoupling capacitors 212A, 212B, and 212C may be adjusted post-silicon based on measurement and/or testing. The diversity may also be provided using different types of capacitors. For example, the decoupling capacitor 212A may comprise MIM capacitors only while the decoupling capacitor 212B may comprise MOM capacitors only. Alternatively, each of the decoupling capacitors 212A, 212B, 212C may have different combinations of varied types of capacitors. For example, the decoupling capacitors 212B and 212C may comprise both MIM and MOM capacitors but the decoupling capacitor 212B has more MIM capacitors than the decoupling capacitor 212C. The diversity alternatively may be provided through a combination of different means. A different means and/or their combination provide the flexibility to fully using available resource on-chip and improve the randomness of power distribution network variation in different processing units. For example, there may be area for MOM capacitors, MOS capacitor, or MIM capacitor depending on the process technology, placement and routing, and design choices. A combination of different means offers the opportunity to minimize resource requirement while reduce the likelihood of random failures affecting all of the plurality of processing units in similar fashion and resulting in false negative in a redundant system.

Alternatively, the diversity of the power distribution networks for different processing units may be done through the placement of the decoupling capacitors. FIG. 4A illustrates an exemplary redundant system power distribution networks decoupling capacitors placement according to certain aspect of the present disclosure. The SoC 400 may be an exemplary physical embodiment of the SoC 200. Like the SoC 200, the SoC 400 comprises a plurality of redundant processing units, a first processing unit 402A, a second processing unit 402B, and a third processing unit 402C. All of the processing units 402A, 402B, and 402C are identical, meaning, except for unavoidable variation, they have same circuit design, including same circuit specification, configuration, and physical layout and footprint so that given identical inputs— and barring any unique processing errors—each would produce identical outputs. The processing units 402A, 402B, and 402C, however, may be in different location as illustrated here (but often in adjacent area) and may have different orientation. A black square, 416A, 416B, or 416C, in each of the processing units 402A, 402B, and 402C denotes the reference point. Here, the processing unit 402B is at the right of the processing unit 402A. The processing unit 402C is below both the processing units 402A and 402B. In addition, the processing unit 402C rotated 90 degree counterclockwise relative to both the processing units 402A and 402B.

The power distribution network (not shown) in each of the processing units 402A, 402B, and 402C couples to a respective decoupling capacitor, e.g., a first decoupling capacitor 412A, a second decoupling capacitor 412B, or a third decoupling capacitor 412C. The decoupling capacitors 412A, 412B, and 412C may be the decoupling capacitors in FIGS. 3A-3C or may be some other suitable capacitors. The decoupling capacitors 412A, 412B, and 412C may have same capacitance values or may be different. The locations of the decoupling capacitors 412A, 412B, or 412C within each of the processing units 402A, 402B, and 402C are different. Using the black square 416A, 416B, and 416C as reference points, the decoupling capacitor 412A for the processing unit 402A is at the top left while the decoupling capacitor 412B for the processing unit 402B is in the middle and the decoupling capacitor 412C for the processing unit 402C is at the top right. Because of the different locations, the effect of each of the decoupling capacitors on the respective power distribution network is different. Diversity, therefore, results.

Figure 4B:
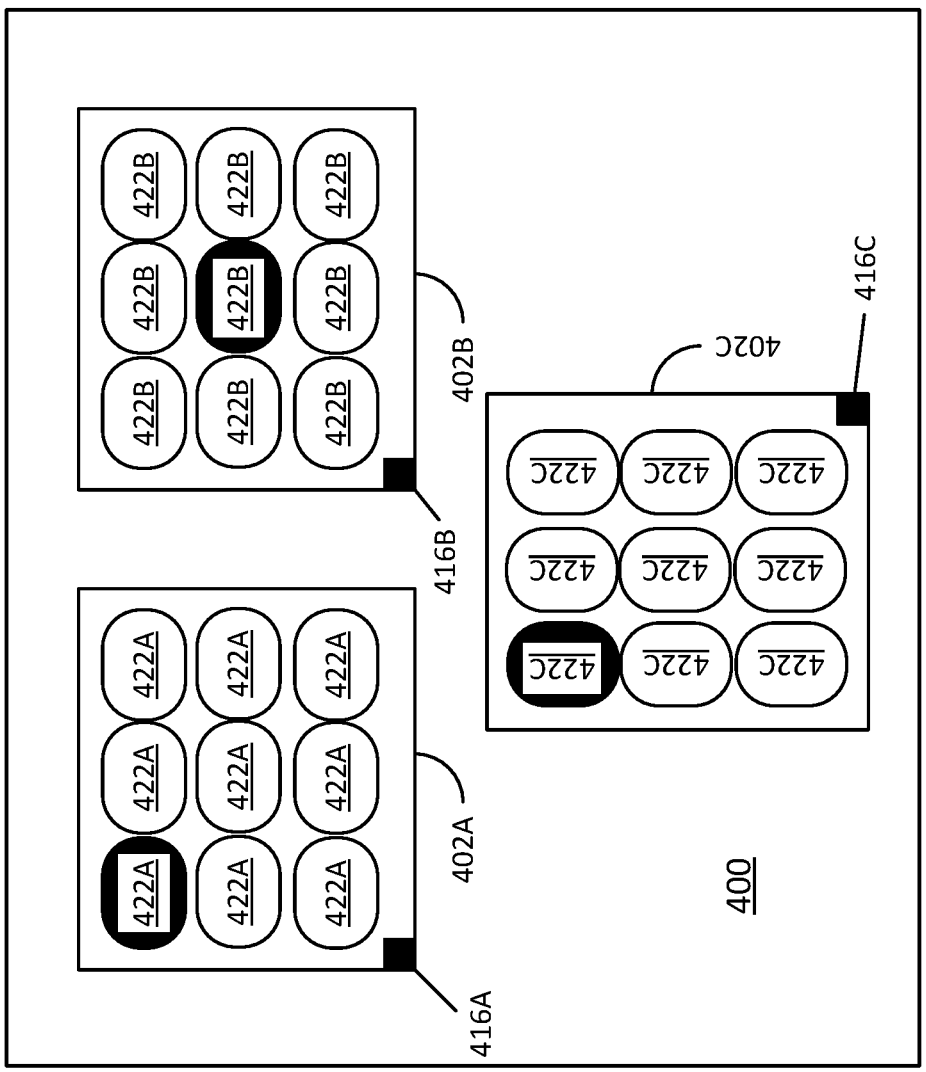
FIG. 4B illustrates an exemplary alternative redundant system power distribution networks decoupling capacitor placement according to certain aspect of the present disclosure.

One sample implementation of FIG. 4A is to have decoupling capacitors at specific location only. Another alternative sample implementation may be placing capacitors at multiple location and selectively couple one or more to a power rail post-silicon through programming. FIG. 4B illustrates an exemplary alternative redundant system power distribution networks decoupling capacitor placement according to certain aspect of the present disclosure. For illustration purpose only, there is a group of 3×3 capacitors placed for each processing unit in FIG. 4B for the SoC 400. For example, there is a first group of capacitors 422A in the region of the processing unit 402A, a second group of capacitors 422B in the region of the processing unit 402B, and a third group of capacitors 422C in the region of the processing unit 402C. Each group of capacitors are identical, meaning they are same in terms of types, footprints, structures, and locations relative to the respective processing unit. Each group of capacitors may be selectively couples to the respective power distribution network to act as decoupling capacitor to the respective power distribution network. For example, for the processing unit 402A, only the top left corner capacitor is selectively coupled to the power distribution network of the processing unit 402A; for the processing unit 402B, only the center capacitor is selectively coupled to the power distribution network of the processing unit 402B; and for the processing unit 402C, only the top right corner capacitor is selectively coupled to the power distribution network of the processing unit 402C. The selective coupling may be done using transistors as switches or eFuses or other suitable means.

Figure 5:
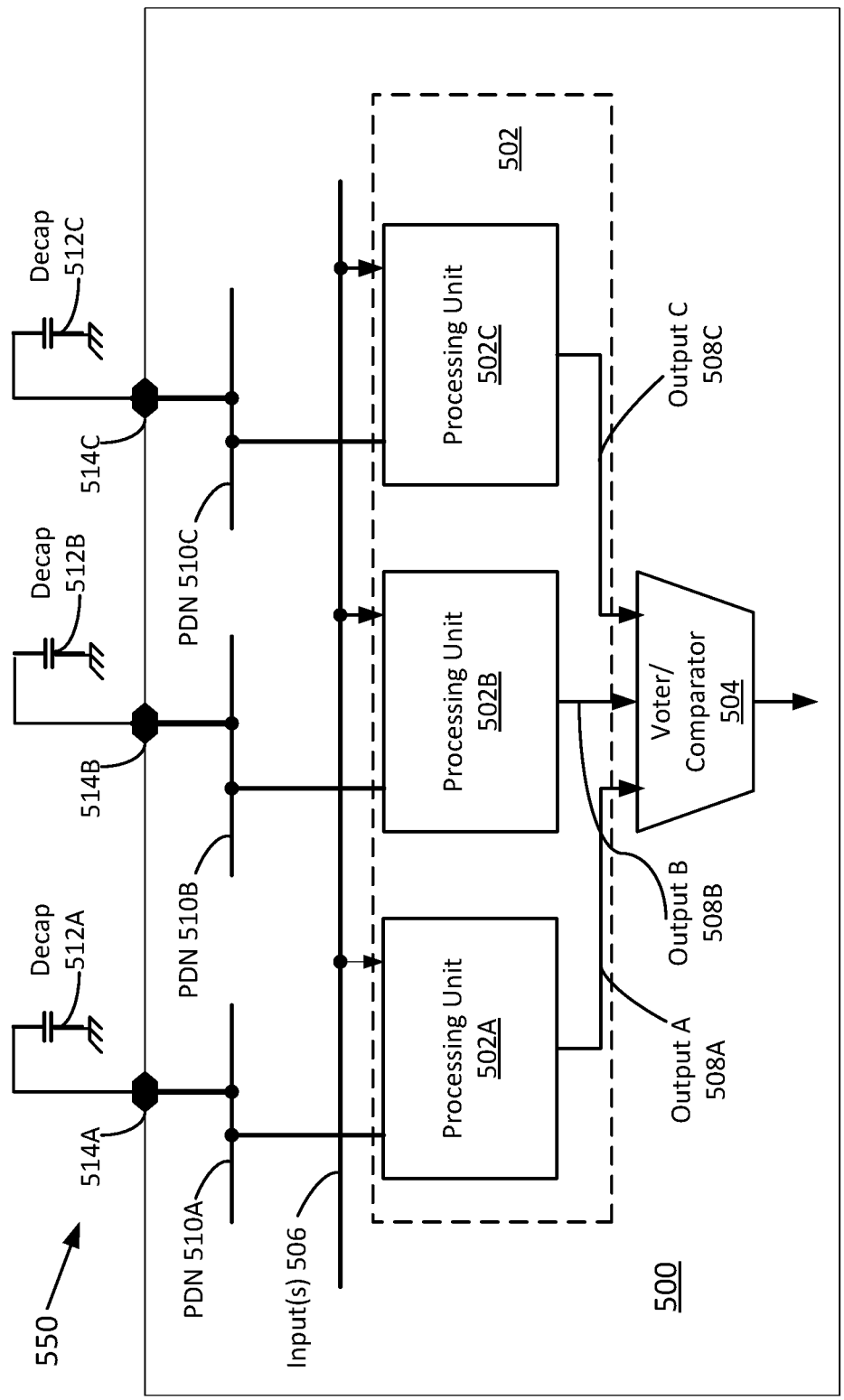
FIG. 5 illustrates another exemplary redundant system power distribution network according to certain aspect of the present disclosure.

FIG. 5 illustrates another exemplary redundant system power distribution network according to certain aspect of the present disclosure. The system 550 comprises two portions: a SoC 500 and off-die components, a plurality of decoupling capacitors such as a first decoupling capacitor 512A, a second decoupling capacitor 512B, and a third decoupling capacitor 512C. The SoC 500 comprises a plurality of redundant processing units 502A, 502B, and 502C, and a voter/comparator 504. All of the processing units 502A, 502B, and 502C are identical, meaning, except for unavoidable variation, they have same circuit design, including same circuit specification, configuration, and physical layout and footprint so that given identical inputs 506—and barring any unique processing errors—each would produce identical outputs 508A, 508B, and 508C. Note that inputs 506 to processing units include both commands and data. The processing units 502A, 502B, and 502C, however, may be in different location (but often in adjacent area) and may have different orientation.

A processing unit 502A, 502B, or 502C may be, for example, a central processing unit (CPU), a graphics processing unit (GPU), a neural-network processing unit (NPU), a digital signal processor (DSP), or other processor/ controller. When each of the plurality of processing units 502A, 502B, and 502C performs redundant processing of corresponding identical inputs 506, the voter/comparator 504 compares corresponding output signals—such as, e.g., outputs 508A, 508B, and 508C—of the processing units 502A, 502B, and 502C to determine whether a unique processing error occurred in one of the processing units 502A, 502B, and 502C. Specifically, if the voter/comparator 504 determines that the outputs 508A, 508B, and 508C are not all identical, then the voter/comparator 504 provides an output indicating that at least one of the processing units 502A, 502B, and 502C suffered a processing error.

The SoC 500 also comprises a plurality of local power distribution networks, a first power distribution network 510A, a second power distribution network 510B, and a third power distribution network 510C, coupled to respective processing units 502A, 502B, and 502C. For example, the local power distribution network 510A couples to the processing unit 502A, the local power distribution network 510B couples to the processing unit 502B, and the local power distribution network 510C couples to the processing unit 502C.

Each of the plurality of local power distribution networks 510A, 510B, and 510C has one or more IO terminals 514A, 514B, or 514C that provides coupling of the respective local power distribution network 510A, 510B, or 510C to one of the decoupling capacitors 512A, 512B, and 512C. For example, the first one or more IO terminals 514A provide a first interface for coupling between the local power distribution network 510A with the decoupling capacitor 512A, the second one or more IO terminals 514B provide a second interface for coupling between the local power distribution network 510B with the decoupling capacitor 512B, and the third one or more IO terminal 514C provide a third interface for coupling between the local power distribution network 510C with the decoupling capacitor 512C. The IO terminals 514A, 514B, and 514C refer to the interface for external connections of the SoC 500 that tie it to the outside world. If the SoC 500 is a die, then IO terminals 514A, 514B, and 514C are IO pads on the die. If the SoC 500 is a chip, then IO terminals 514A, 514B, and 514C are IO pins on a packaging substrate.

The decoupling capacitors 512A, 512B, and 512C may be on or embedded in a packaging substrate or a PCB. They may be ceramic capacitors, film and paper capacitor, aluminum, tantalum and niobium electrolytic capacitor, polymer capacitor, to name a few. The capacitance of each of the decoupling capacitors 512A, 512B, and 512C may be different to generate diversity in the power delivery to the processing units 502A, 502B, and 502C. To enable different capacitance, the decoupling capacitors 512A, 512B, and 512C may be programmable or tunable.

Figure 6:
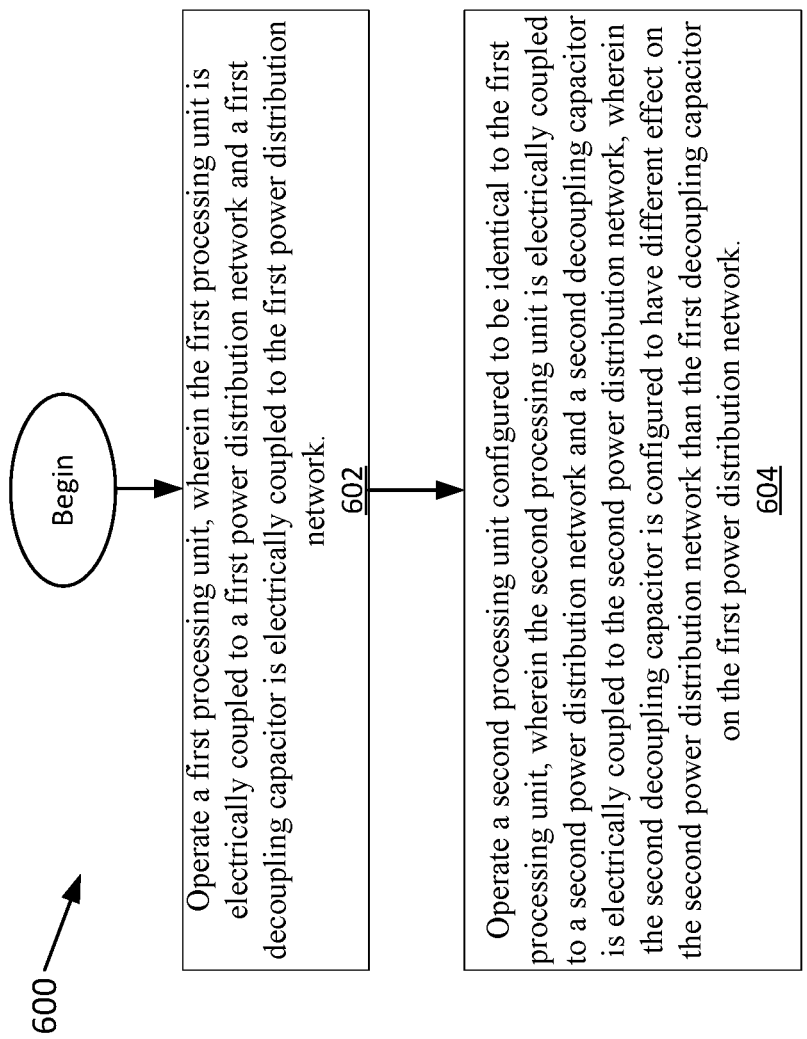
FIG. 6 illustrates an exemplary method of operating a redundant system according to certain aspect of the present disclosure.

FIG. 6 illustrates an exemplary method 600 of operating a redundant system according to certain aspect of the present disclosure. At 602, a first processing unit (e.g., the processing unit 202A, 202B, 202C, 402A, 402B, 402C, 502A, 502B, or 502C) is operated. The first processing unit is electrically coupled to a first power distribution network (e.g., the power distribution network 210A, 210B, 210C, 510A, 510B, or 510C). A first decoupling capacitor (e.g., the decoupling capacitor 212A, 212B, 212C, 412A, 412B, 412C, 512A, 512B, or 512C) is electrically coupled to the first power distribution network.

At 604, meanwhile, a second processing unit (e.g., the processing unit 202A, 202B, 202C, 402A, 402B, 402C, 502A, 502B, or 502C that is not the first processing unit) is operated. The second processing unit is configured to be identical to the first processing unit. The second processing unit is electrically coupled to a second power distribution network (e.g., the power distribution network 210A, 210B, 210C, 510A, 510B, or 510C). A second decoupling capacitor (e.g., the decoupling capacitor 212A, 212B, 212C, 412A, 412B, 412C, 512A, 512B, or 512C) is electrically coupled to the second power distribution network. The second decoupling capacitor is configured to have different effect on the second power distribution network than the first decoupling capacitor on the first power distribution network.

The different effect may be derived from varied means. For example, the first decoupling capacitor may have a first decoupling capacitance value and the second decoupling capacitor has a second decoupling capacitance value that is different from the first capacitance value. Both the first decoupling capacitor and the second decoupling capacitor may be programmable (e.g., the decoupling capacitor 300A, 300B, or 300C). As an alternative example, the different effect may be derived from the placement of the first decoupling capacitor and the second decoupling capacitor. The location of the first decoupling capacitor relative to the first processing unit may be different from the location of the second decoupling capacitor relative to the second processing unit (e.g., the placement of decoupling capacitors in 400).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A device, comprising:
   a first processing unit;
   a first power distribution network coupled to the first processing unit;
   a first decoupling capacitor coupled to the first power distribution network;
   a first switch coupled to the first decoupling capacitor for adjusting capacitance of power signals received by the first processing unit from the first power distribution network;
   a second processing unit configured to be identical and redundant to the first processing unit, the second processing unit receiving input identical to input received by the first processing unit and the second processing unit performing processes with the input that are identical to processes performed by the first processing unit;
   a second power distribution network coupled to the second processing unit;
   a second decoupling capacitor coupled to the second power distribution network, wherein the second decoupling capacitor is configured to have different effect on the second power distribution network than the first decoupling capacitor on the first power distribution network;
   a second switch coupled to the second decoupling capacitor for adjusting capacitance of power signals received by the second processing unit from the second power distribution network; and
   a comparator coupled to the first processing unit and second processing unit for comparing outputs of the first processing unit and second processing unit, the comparator determining if at least one of the processing units has suffered a processing error.

2. The device of claim 1, wherein the first decoupling capacitor has a first capacitance value and the second decoupling capacitor has a second capacitance value that is different from the first capacitance value.

3. The device of claim 1, wherein the first decoupling capacitor is programmable.

4. The device of claim 3, wherein the first decoupling capacitor is one-time programmable by a plurality of eFuses.

5. The device of claim 4, wherein the plurality of eFuses is programmed through laser.

6. The device of claim 4, wherein the plurality of eFuses is programmed through a programming voltage.

7. The device of claim 3, wherein the first decoupling capacitor comprises a plurality of capacitors and a plurality of switches each couples to one of the plurality of capacitors.

8. The device of claim 1, wherein each of the plurality of switch is a transistor.

9. The device of claim 1, wherein each of the plurality of switch is an eFuse.

10. The device of claim 1, wherein a location of the first decoupling capacitor relative to the first processing unit is different from a location of the second decoupling capacitor relative to the second processing unit.

11. The device of claim 10 further comprising: a first group of capacitors in a region of the first processing unit; a second group of capacitors in a region of the second processing unit, wherein the second group of capacitors is identical to the first group of capacitors.

12. The device of claim 11, wherein the first decoupling capacitor is one or more of the first group of capacitors and the second decoupling capacitor is one or more of the second group of capacitors.

13. The device of claim 12, wherein the first decoupling capacitor is configured to couple to the first power distribution network by selectively coupling one or more of the first group of capacitors and the second decoupling capacitor is configured to couple to the second power distribution network by selectively coupling one or more of the second group of capacitors.

14. The device of claim 1 wherein the first processing unit and the second processing are in a system-on-chip (SoC) and the first decoupling capacitor and the second decoupling capacitor are off the SoC.

15. The device of claim 14 further comprising first one or more TO terminals configured to provide a first interface for coupling the first decoupling capacitor with the first power distribution network and second one or more IO terminals configured to provide a second interface for coupling the second decoupling capacitor with the second power distribution network.

16. The device of claim 14, wherein the first decoupling capacitor and the second decoupling capacitor are in a packaging substrate.

17. The device of claim 14, wherein the first decoupling capacitor and the second decoupling capacitor are in a PCB.

18. The device of claim 1, wherein the comparator is configured to determine if an output of the first processing unit and an output of the second processing unit are identical.

19. The device of claim 1 further comprising a third processing unit configured to be identical to the first processing unit and the second processing unit; a third power distribution network coupled to the third processing unit; and a third decoupling capacitor coupled to the third power distribution network, wherein the third decoupling capacitor is configured to have different effect on the third power distribution network than the first decoupling capacitor on the first power distribution network or the second decoupling capacitor on the second power distribution network.

20. The device of claim 1, wherein the first processing unit, the first power distribution network, the first decoupling capacitor, the second processing unit, the second power distribution network, and the second decoupling capacitor are integrated in a system-on-chip (SoC).

21. A method, comprising:
operating a first processing unit, wherein the first processing unit is electrically coupled to a first power distribution network and a first decoupling capacitor is electrically coupled to the first power distribution network, a first switch coupled to the first decoupling capacitor for adjusting capacitance of power signals received by the first processing unit from the first power distribution network;
operating a second processing unit configured to be identical and redundant to the first processing unit, the second processing unit receiving input identical to input received by the first processing unit and the second processing unit performing processes with the input that are identical to processes performed by the first processing unit, wherein the second processing unit is electrically coupled to a second power distribution network and a second decoupling capacitor is electrically coupled to the second power distribution network, a second switch coupled to the second decoupling capacitor for adjusting capacitance of power signals received by the second processing unit from the second power distribution network, wherein the second decoupling capacitor is configured to have different effect on the second power distribution network than the first decoupling capacitor on the first power distribution network;
comparing with a comparator coupled to the first processing unit and second processing unit outputs of the first processing unit and second processing unit, and
determining with the comparator if at least one of the processing units has suffered a processing error.

22. The method of claim 21, wherein the first decoupling capacitor has a first capacitance value and the second decoupling capacitor has a second capacitance value that is different from the first capacitance value.

23. The method of claim 21, wherein the first decoupling capacitor is programmable.

24. The method of claim 21, wherein a location of the first decoupling capacitor relative to the first processing unit is different from a location of the second decoupling capacitor relative to the second processing unit.

25. The method of claim 24 further comprising: selectively coupling one or more of a first group of capacitors in a region of the first processing unit to the first power distribution network; and selectively coupling one or more of a second group of capacitors in a region of the second processing unit to the second power distribution network, wherein the second group of capacitors is identical to the first group of capacitors.

26. The method of claim 25, wherein the first decoupling capacitor is one or more of the first group of capacitors and the second decoupling capacitor is one or more of the second group of capacitors.

27. The method of claim 21 wherein the first processing unit and the second processing are in a system-on-chip (SoC) and the first decoupling capacitor and the second decoupling capacitor are off the SoC.

28. The method of claim 27 wherein the SoC comprises first one or more IO terminals configured to provide a first interface for coupling the first decoupling capacitor with the first power distribution network and second one or more IO terminals configured to provide a second interface for coupling the second decoupling capacitor with the second power distribution network.

29. The method of claim 21 further comprising determining if an output of the first processing unit and an output of the second processing unit are identical.

30. The method of claim 21, wherein the first processing unit, the first power distribution network, the first decoupling capacitor, the second processing unit, the second power distribution network, and the second decoupling capacitor are integrated in a system-on-chip (SoC).

* * * * *